Dec. 8, 1970 HANS-JÜRGEN BREUER 3,546,613
CONNECTION FOR REDUCING THE LOSS OF EFFECT IN A FEED-BACK CONNECTED TRANSISTOR AMPLIFIER
Filed May 29, 1968
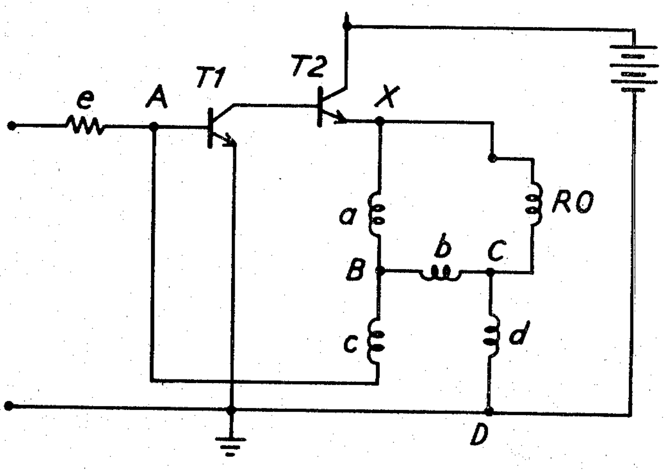
INVENTOR
HANS-JÜRGEN BREUER
BY Hane and Baxley
ATTORNEYS United States Patent Office 3,546,613

Patented Dec. 8, 1970

3,546,613
CONNECTION FOR REDUCING THE LOSS OF EFFECT IN A FEED-BACK CONNECTED TRANSISTOR AMPLIFIER

Hans-Jürgen Breuer, Alvsjo, Sweden, assignor to Telefonaktiebolaget L M Ericsson, Stockholm, Sweden, a corporation of Sweden Filed May 29, 1968, Ser. No. 733,183
Claims priority, application Sweden, June 29, 1967, 9,645/67
Int. Cl. H03f *1/14*
U.S. Cl. 330—20 2 Claims

ABSTRACT OF THE DISCLOSURE

A transistor amplifier comprises two transistors connected in cascade. The input transistor receives a signal to be amplified and a feedback signal. The output transistor is in a grounded-collector configuration with its emitter connected to two parallel impedance branches. The first branch comprises a load impedance and a balance impedance with the free end of the latter grounded. The second branch comprises another balance impedance and a load matching impedance with the free end of the latter connected to the input transistor. A diagonal impedance interconnects the series junctions of the impedance branches The balance impedances have such values that substantially no current flows through the diagonal impedance in the absence of signal reflections.

The present invention relates to feedback amplifiers, and more particularly to a connection for reducing the loss of effect in a feedback connected transistor amplifier with an adding junction for the input and feedback signals on the input side of the amplifier, and a final stage with an adaptable output impedance and a grounded collector.

It is known to use a grounded collector connection in the final stage of transistor amplifiers, within the audio range as well as within the high freqency range because such a final stage has a small phase shift and a constant voltage amplification up to relatively high frequencies. An amplifier using a grounded collector connection in the final stage, giving a very low output impedance is also known. In a feedback connection, the output impedance decreases even more. If matching to the load is desired, by a resistance of the size of the load being connected in series with the output, the terminal voltage will be half the output voltage. This implies that half the output power is used up in the matching resistance. Furthermore the impedance level at the emitter is raised at the same time, the result being that at high frequencies further difficulties will arise concerning the choice of components. This means that an effect about 3 db higher is spent in the feedback circuit in comparison with a connection, where the output voltage does not have to be halved by means of a series impedance.

An object of the invention is to raise the lower output impedance of the grounded collector stage by connecting, in the emitter circuit, an output network consisting of two parallel branches, in balance with each other.

The connection according to the invention is characterized in that the emitter of the transistor in the final stage is connected to two parallel current branches. One of the branches is connected to ground across the load impedance of the amplifier and a balance impedance is connected in series with the load impedance. The other of the current branches is connected to an adding or summing point for the input and feedback signals across a second balance impedance and an impedance equal to the load impedance. A diagonal impedance is connected between the connecting points of the impedances of the current branches respectively and dimensioned so that an output impedance of a desired value is obtained from the amplifier. The balance is dimensioned so that the diagonal impedance is practically currentless when there are no reflected signals on the output. In addition, this is connected between the adding point for the input and feedback signals and said final stage at least one voltage amplifying transistor stage so that the final stage is controlled between its base and ground.

The invention will be described in detail with reference to the accompanying drawing which shows such a connection according to the invention. The connection consists of a feedback connected transistor amplifier with an adding point A, to which are fed an input signal across a resistance *e* as well as a feedback signal from a final stage. A transistor T1, forming an amplification stage, is connected with its base to adding point A and its emitter-collector circuit connected between ground and the input of the final stage which includes transistor T2. The base of transistor T2 is the input of the final stage, the collector of transistor T2 being grounded and its emitter being connected to two parallel current branches. One of the current branches is connected to ground across the load impedance RO in series with a balance impedance *d*. The other branch is connected to the adding point A, via a balance impedance *a* connected in series with an impedance *c*, the impedance *c* being equal to the load impedance RO. Between the connecting points B and C between the impedances of the branches respectively, a diagonal impedance *b* is connected, the value of which is determined by the desired value of the output impedance of the amplifier connection, measured between the points X and C. The adding point A receives a potential value, practically equal to that of the grounded point D. Thus it is possible by a suitable dimensioning of the balance impedances *a* and *d* to keep the diagonal impedance *b* currentless when there are no reflected signals from the output. Because of this balance condition there will be no loss of effect in the diagonal impedance *b*. Furthermore the balance impedance *d* will get an approximative value of *RO/F*, F being the amplification factor. Consequently impedance *d* will in general be a low impedance, considerably lower than the matching impedance required in the conventional arrangements, and thus the loss of effect will be lower. The loss of effect in the impedance *a* will be the same as that in the impedance *d*, that is quite low, and that of impedance *c* will be almost neglectable due to the balance condition.

With a connection according to the invention it is thus possible to make use of the good harmonic distortion qualities of a grounded collector stage and at the same time lower the loss of effect in comparison with arrangements known before.

I claim:

1. A feedback amplifier comprising a transistor amplifier having an input terminal, a grounded reference terminal and an output terminal, a signal summing junction connected to said input terminal, means for applying an external signal to said signal summing junction, a first transistor having base, collector and emitter electrodes, means connecting the output terminal of said transistor amplifier to the base electrode of said first transistor, means for grounding the collector terminal of said first transistor, a load impedance and a first balancing impedance connecting the emitter electrode of said first transistor to ground, a second balancing impedance and a further impedance connecting the emitter electrode of said first transistor to said signal summing junction, said further impedance and said load impedance having the same values, and a diagonal impedance connecting the junction of said load impedance and said first balancing impedance to the junction of said second balancing impedance and said further impedance, said balancing impedances having such values that substantially no current flows through said diagonal impedance when there are no reflected signals from said load impedance and only one of said balancing impedances being directly connected to the emitter electrode of said first transistor.

2. The feedback amplifier of claim 1 wherein said transistor amplifier comprises a transistor having base, emitter and collector electrodes, said base electrode being said input terminal, said collector electrode being said output terminal and directly connected to the base electrode of said first transistor and said emitter electrode being said reference terminal and directly connected to ground.

References Cited

UNITED STATES PATENTS 3,256,490 6/1966 Gohm -------------- 330—28X

ROY LAKE, Primary Examiner

J. B. MULLINS, Assistant Examiner

U.S. Cl. X.R.

330—27